United States Patent [19]

Kuramata

[11] Patent Number: 5,379,720
[45] Date of Patent: Jan. 10, 1995

[54] PROCESS FOR GROWING SEMICONDUCTOR CRYSTAL

[75] Inventor: Akito Kuramata, Kawasaki, Japan

[73] Assignee: Fujitsu Limited, Kawasaki, Japan

[21] Appl. No.: 229,099

[22] Filed: Apr. 18, 1994

Related U.S. Application Data

[63] Continuation of Ser. No. 97,092, Jul. 13, 1993, abandoned, and a continuation of Ser. No. 863,783, Apr. 6, 1992, abandoned.

[30] Foreign Application Priority Data

Apr. 4, 1991 [JP] Japan ............... 3-150820

[51] Int. Cl.$^6$ ........................... C30B 25/02
[52] U.S. Cl. ............... 117/104; 117/953; 117/88
[58] Field of Search ............ 117/104, 88, 93, 953; 437/104

[56] References Cited

PUBLICATIONS

Takeda et al, "Characterization of InP Grown by CMVPE Using Tertiery-butylphosphine for the Phosphorous Source", Jap. Jour. of Applied Physics, vol. 29, No. 1 Jan. 1990 pp. 11–18.
Pan et al, "InAlAs/InP Modulation Doped Heterostructure by Atmospheric Pressure ...", Applied Physics Letters 61(21) Nov. 23, 1992 pp. 2572–2574.
M. Sugo et al.: "n+-p-p+ Structure InP Solar Cells Grown by Organometallic Vapor-Phase Epitaxy," IEEE Transactions On Electron Devices, vol. ED-34, No. 4, Apr. 1987, New York, N.Y., pp. 772–777.
B. Rose et al.: "Si Incorporation in InP using a Disilane Source in Metalorganic Vapour Phase Epitaxy at Atmospheric Pressure," Journal Of Crystal Growth, vol. 94, No. 3, Mar. 1989, Amsterdam, NL, pp. 762–766.
U. Sudarsan et al.: "Ultraviolet laser-induced low-temperature epitaxy of GaP," Applied Physics Letters, vol. 55, No. 8, 21 Aug. 1989, New York, N.Y., pp. 739–740.
R. Huang et al.: "High quality Fe-doped semi-insulating InP epitaxial layers grown by low-pressure organometallic vapor phase epitaxy using tertiarybutylphosphine," Applied Physics Letters, vol. 58, No. 2, 14 Jan. 1991, New York, N.Y., pp. 170–172.

*Primary Examiner*—Robert Kunemund
*Attorney, Agent, or Firm*—Staas and Halsey

[57] ABSTRACT

A process for growing a semiconductor crystal, comprising growing a group III–V compound semiconductor containing P as a group V element by an organometal vapor phase epitaxy by using tertiary butyl phosphine (TBP) as a source of P constituting a grown layer and doping the semiconductor with a dopant gas during a growth of the semiconductor. In this process, the source gas and dopant gas are fed under a condition satisfying a requirement represented by the following formula, to conduct a growth of the crystal:

$$n \leq \eta(T) \frac{f_0^{2\alpha}(P_{TBP}^0 \cdot P_D^0)^\alpha}{f_{TBP}^\alpha} \cdot P_0^{\beta-2} \quad (1)$$

wherein n is a carrier concentration of the growing semiconductor crystal, T is a temperature of the substrate and an atmosphere in the vicinity of the substrate, $P_{TBP}^0$ is an equilibrium vapor pressure of TBP or a decomposition product thereof, $P_D^0$ is an equilibrium vapor pressure of a dopant or a decomposition product thereof, $P_0$ is a total pressure, $f_0$ is a total flow rate, and $f_{TBP}$ is a flow rate of TBP.

6 Claims, 8 Drawing Sheets

PROCESS FOR GROWING SEMICONDUCTOR CRYSTAL

This application is a continuation of application Ser. No. 08/097,092, filed Jul. 18, 1993, now abandoned, and is a continuation of U.S. patent application Ser. No. 07/863,783, filed Apr. 6, 1992, now abandoned.

BACKGROUND OF THE INVENTION

1. Field of the Invention

The present invention relates to a process for growing a semiconductor crystal. More particularly, the present invention relates to a doping method for use in the crystal growth of a compound semiconductor containing P, by metal organic vapor phase epitaxy (MOVPE).

2. Description of the Related Art

The practical use of MOVPE has been promoted as a process for growing a next generation crystal, because MOVPE has an excellent controllability and homogeneity of the film thickness and composition, etc., of the grown crystal, and enables the growth to be conducted on a substrate having a large area and a plurality of sheets of a substrate. Nevertheless, the arsine ($AsH_3$) and phosphine ($PH_3$) commonly used as a group V element source in MOVPE are extremely dangerous, as they are high-pressure gases having a strong toxicity, and this has inhibited the practical use of MOVPE.

The present inventors have conducted the growth of InP, InGaAs and InGaAsP crystals through the use of tertiary butyl arsine (TBA) and tertiary butyl phosphine (TBP), which are liquids having a low toxicity, as the group V element source to thereby improve the safety factor, and have succeeded in forming a crystal having a high purity. In this case, it is necessary to establish p-type and n-type doping techniques as a growing technique for preparing a semiconductor device.

The n-type doping of GaAs with disilane ($Si_2H_6$) is known as an example of doping during a growth in which TBA is used as the group V element source, and although it is reported that a good doping can be conducted by this method, there is no report on the use of TBP as the group V element source. Accordingly, an attempt to grow an InP crystal has been made through the use of TBP as the group V element source and monosilane ($SiH_4$, which is a dopant usually employed in the growth wherein use is made of $PH_3$ as the group V element material) as an n-type dopant. In this case, the growth of the InP crystal was conducted under the same conditions as usually employed for a growth under a reduced pressure through the use of $PH_3$ (growth temperature: 600° C., growth pressure: 76 Torr, flow rate of carrier gas: 6 liters/min, growth rate: 1.2 μm/hr, V/III ratio: 200, $SiH_4$ flow rate: 0.005 cc/min). Nevertheless, the intended single crystal was not grown; the grown crystal was polycrystalline. When the growth was conducted under the same conditions as used above, through the use of $PH_3$, a single crystal having a surface free from defects was obtained with a carrier concentration of $2.4 \times 10^{18}$ cm$^{-3}$. A comparison of both cases is shown in FIG. 4. Further, in a growth in which use was made of TBP, although a single crystal was obtained by reducing the flow rate of $SiH_4$ to 0.0002 cc/min, it was found that the single crystal had a surface having a number of pits (small holes), i.e., the surface state was poor, as shown in FIG. 5. The carrier concentration in this case was $6.8 \times 10^{17}$ cm$^{-3}$.

Although TBP is a very safe source material, the reason for the above-described drawback is believed to be that, since the reactivity of TBP (or a deposition product thereof) is larger than that of $PH_3$, a vapor phase reaction occurs between the dopant and the group V element source (TBP). This problem is characteristic of TBP, and has not hitherto been pointed out in the art.

SUMMARY OF THE INVENTION

The growth of a single crystal is indispensable to the production of an electronic device, and a surface defect, such as a pit, has a remarkably adverse effect on the properties of the device. An object of the present invention is to provide a process for growing a single crystal free from surface defects through the prevention of a vapor phase reaction between a highly reactive TBP and a dopant in the doping of a P-containing compound semiconductor (InP, InGaAsP or the like) by using TBP as the group V element source.

To solve the above-described problems, the present invention provides a process for growing a semiconductor crystal, comprising growing a group III–V compound semiconductor containing P as a group V element by a metal organic vapor phase epitaxy by using tertiary butyl phosphine (TBP) as a source of P constituting a grown layer, and doping the semiconductor with a dopant gas during the growth of the semiconductor. This process is characterized in that the source gas and the dopant gas are fed under a condition satisfying a requirement represented by the following formula, to conduct the growth of the crystal:

$$n \leq \eta(T) \frac{f_0^{2\alpha}(P_{TBP}^0 \cdot P_D^0)^\alpha}{f_{TBP}^\alpha} \cdot P_0^{\beta-2} \qquad (1)$$

wherein n is a carrier concentration of the growing semiconductor, T is a temperature of the substrate and an atmosphere in the vicinity of the substrate, $P_{TBP}^0$ is an equilibrium vapor pressure of TBP or a decomposition product thereof, $P_D^0$ is an equilibrium vapor pressure of a dopant or a decomposition product thereof, $P_0$ is a total pressure, $f_0$ is a total flow rate, and $f_{TBP}$ is a flow rate of TBP.

DESCRIPTION OF THE PREFERRED EMBODIMENTS

Figure 1:
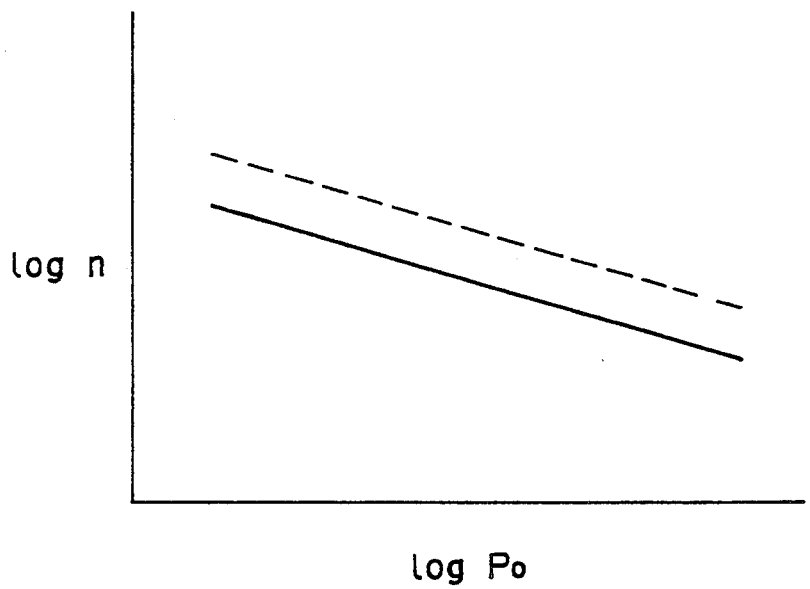
FIG. 1 is a schematic diagram showing the relationship between the carrier concentration n capable of conducting doping and the total pressure $P_0$.

Examples of useful dopants include monosilane, disilane, hydrogen sulfide, diethyl telluride, diisopropyl telluride, diethyl selenide, diisopropyl selenide, diethyl sulfide, tetraethyl tin, and tetramethyl tin.

The causes of the growth of a polycrystal and the formation of a pit are considered to be that TBP (or a decomposition product thereof) reacts with a dopant (or a decomposition product thereof) in a vapor phase to form a solid phase nucleus which is deposited on a substrate to inhibit a normal growth of a single crystal. It is considered that the formation of a solid phase nucleus occurs only when the growth condition exceeds a certain critical condition, and no solid phase nucleus forms when the growth condition deviates from the critical condition. For example, when the growth pressure is taken as an example, there exists a critical pressure for the formation of a solid phase nucleus determined depending upon the flow rate of TBP, the flow rate of dopant gas, the growth temperature, the flow rate of carrier gas, and the configuration of the reaction tube. When the growth pressure is below the critical pressure, the formation of the solid phase nucleus is completely prevented. Since the surface state of the crystal rapidly changes, with the critical pressure as a boundary, whether or not the solid phase nucleus has been formed can be determined from the surface state of the grown crystal. Examples of the factors to be considered as critical conditions include a growth pressure, a growth temperature, a TBP flow rate, a carrier gas flow rate, and molar fractions of the TBP (or a decomposition product thereof) and the dopant (or a decomposition product thereof).

A regulation of the growth pressure, the growth temperature, the TBP flow rate, the carrier gas flow rate, and the molar fractions of the TBP (or the decomposition product thereof) and the dopant (or the decomposition product thereof) is considered to effectively prevent the formation of the solid phase nucleus.

Further, although it is possible that the adoption of such a means will have an adverse effect on the growth of the InP crystal per se, which is a vital point even though the occurrence of the vapor phase nucleus is prevented, such an adverse effect can be avoided by exciting the crystal surface alone, by using an electron beam, X-ray or the like.

The features of the present invention will now be described in more detail.

For example, in a reaction of TBP (a gas) with a dopant D (a gas) to produce a solid, the following relationship is established between the free energy change $\Delta G$ and the respective equilibrium vapor pressures, $P_{TBP}^0$ and $P_D^0$, of TBP and the dopant D:

$$\Delta G = -RT\ln\frac{1}{P_{TBP}^0 \cdot P_D^0} \quad (2)$$

wherein R is a gas constant and 1.987 and T is a temperature of the substrate and in the vicinity of the substrate. Since the free energy change $\Delta G$ can be expressed by the following formula $$\Delta G = \Delta H - \Delta ST$$

wherein $\Delta H$ is an enthalpy change and $\Delta S$ is an entropy change, the product of the equilibrium vapor pressures $P_{TBP}^0 \cdot P_D^0$ can be expressed by the following formula:

$$P_{TBP}^0 \cdot P_D^0 = \exp\left(\frac{\Delta H}{RT}\right)\exp\left(\frac{-\Delta S}{R}\right) \quad (4)$$

Nevertheless, the reaction of the gaseous TBP with the gaseous D actually occurs when the respective partial pressure, $P_{TBP}$ and $P_D$, of the gaseous TBP and the gaseous D exceeds the product of the equilibrium vapor pressures $P_{TBP}^0 \cdot P_D^0$ (i.e., $P_{TBP} \cdot P_D > P_{TBP}^0 \cdot P_D^0$).

Whether or not the reaction actually occurred can be determined by an observation of the surface of the grown crystal. Therefore, when the product of partial pressures at a boundary where the change of the crystal surface occurs is determined by varying the product of the partial pressure $P_{TBP} \cdot P_D$ while the temperature is fixed to $T_1$, this gives the product of the equilibrium vapor pressures $(T=T_1)$ at the temperature $T_1$. Further, at a different temperature $T_2$, $P_{TBP}^0 \cdot P_D^0$ $(T=T_2)$ is determined. When the product of the equilibrium vapor pressures $P_{TBP}^0 \cdot P_D^0$ is determined at two different temperatures, $\Delta H$ and $\Delta S$ can be determined according to the above-described formula, and thus the product of equilibrium vapor pressures can be obtained at an arbitrary temperature.

This will now be described in more detail by taking as an example the use of $SiH_4$ as a dopant. The following results were obtained at a growth temperature of 600° C.

| Growth Pressure | $P_{TBP}$ | $P_{SiH4}$ | $P_{TBP} \cdot P_{SiH4}$ | Reaction |
|---|---|---|---|---|
| 76 | $8.3 \times 10^{-4}$ | $3.3 \times 10^{-9}$ | $2.7 \times 10^{-12}$ | occurred |
| 20 | $2.2 \times 10^{-4}$ | $4.4 \times 10^{-9}$ | $9.7 \times 10^{-13}$ | did not occur |

From the above results, it is apparent that the $P_{TBP}^0 \cdot P_{SiH4}^0$ value is $1 \times 10^{-12}$ to $2 \times 10^{-12}$.

Further, the same experiment as described above was conducted at 580° C. and as a result, it was found that the $P_{TBP}^0 \cdot P_{SiH4}^0$ value was $0.8 \times 10^{-12}$.

From the results of the above-described two experiments, $\Delta H$ and $\Delta S$ can be determined according to the above-described formula (4) and are found to be the following respective values.

$$\Delta H = -4.65 \times 10^3 \ [cal/mol]$$

$$\Delta S = 0.8272 \ [cal/mol \cdot deg]$$

Therefore, the $P_{TBP}^0 \cdot P_{SiH4}^0$ value is given by the following formula:

$$P_{TBP}^0 \cdot P_{SiH4}^0 = \exp\left(\frac{-1.65 \times 10^4}{RT}\right)\exp\left(\frac{-0.8272}{R}\right) \quad (5)$$

As described above, to prevent the formation of a solid phase nucleus, i.e., a reaction of the gaseous TBP with the gaseous D, it is necessary to satisfy a requirement represented by the following formula:

$$P_{TBP} \cdot P_D \leq P_{TBP}^0 \cdot P_D^0 \quad (6)$$

Specific examples of the means for satisfying the above-described requirement include a change in the $P_{TBP}^0$ and $P_D^0$ values through a variation in the growth temperature and a change in the $P_{TBP}$ and $P_D$ values through a variation in the growth pressure, the flow rate of carrier gas and the molar fractions of the gaseous TBP and D. Note the carrier concentration must of course be a desired value.

Further, the respective partial pressures, $P_{TBP}$ and $P_D$, of the TBP and the dopant can be expressed by the following formulae:

$$P_{TBP} = P_0 \frac{f_{TBP}}{f_0} \quad (7)$$

$$P_D = P_0 \frac{f_D}{f_0} \quad (8)$$

wherein $P_0$ is a total pressure, $f_0$ is a total flow rate, $f_{TBP}$ is a flow rate of TBP, and $f_D$ is a flow rate of the dopant. When the $f_{TBP}$ value is assumed to be constant, the condition under which the doping can be conducted can be expressed by the following formula, through the substitution of the formulae (2) and (3) for the formula (1).

$$f_D \leq \frac{f_0 \cdot P_{TBP}^0 \cdot P_D^0}{P_0^2 \cdot f_{TBP}} \quad (9)$$

Further, since the carrier concentration n is proportional to the $\alpha$ power of the flow rate of the dopant and to the $\beta$ power of the total pressure $P_0$, it can be expressed by the following formula:

$$n = \eta(T) \cdot f_D^\alpha \cdot P_0^\beta \quad (10)$$

wherein $\eta(T)$ is a function of the temperature T and the flow rate $f_{III}$ of the group III element compound and can be expressed by the following formula:

$$\eta(T) = \frac{1}{f_{III}} (AT + B) \quad (11)$$

In the formula, A, B, $\alpha$ and $\beta$ are each a constant determined by the kind of dopant. For example, in the case of monosilane (SiH4), $A = 2.400 \times 10^{21}$, $B = -1.855 \times 10^{24}$, $\alpha = 1.2$ and $\beta = 1.6$; in the case of disilane (Si2H6), $A = 9.60 \times 10^{20}$, $B = -5.50 \times 10^{23}$, $\alpha = 1.2$ and $\beta = 1.6$; and in the case of hydrogen sulfide (H2S), $A = 8.39 \times 10^{19}$, $B = -7.75 \times 10^{22}$, $\alpha = 1$ and $\beta = 1.4$.

From the formulae (4) and (5), however, the dependency of the carrier concentration capable of conducting doping upon the temperature T and the total pressure $P_0$, is finally determined as shown in the formula (1). In the formula (1), the terms having a temperature dependency are $\eta(T)$ and $(P_{TBP}^0 \cdot P_D^0)$. These dependencies are expressed by the formulae (11) and (4).

The use of SiH4 as a dopant will now be described in more detail. When the temperature is constant, the relationship between the carrier concentration n capable of conducting the doping and the total pressure $P_0$ is schematically shown in FIG. 1. The portion defined by an oblique line is a carrier concentration range wherein the doping can be conducted. It is apparent that the maximum carrier concentration is lowered with an increase in the pressure. Further, as the temperature is increased, both the $\eta(T)$ and $(P_{TBP}^0 \cdot P_D^0)$ values in the formula (1) are increased (see formulae (11) and (4)), and therefore, the oblique line in FIG. 1 shifts to the dotted line. This means that the resultant maximum carrier concentration is increased with an increase in the temperature.

In the actual growth of a crystal, when the pressure is very low or the temperature is very high, a sufficient group V element compound pressure can not be applied, and thus the quality of the crystal is deteriorated. Therefore, the growth is preferably conducted under the conditions of a temperature of from 580° to 650° C. and a pressure of from 10 to 50 Torr, from the practical viewpoint.

A method of lowering the growth pressure through the use of SiH4 as a dopant in the growth of an InP crystal will now be described as an example.

Figure 2:
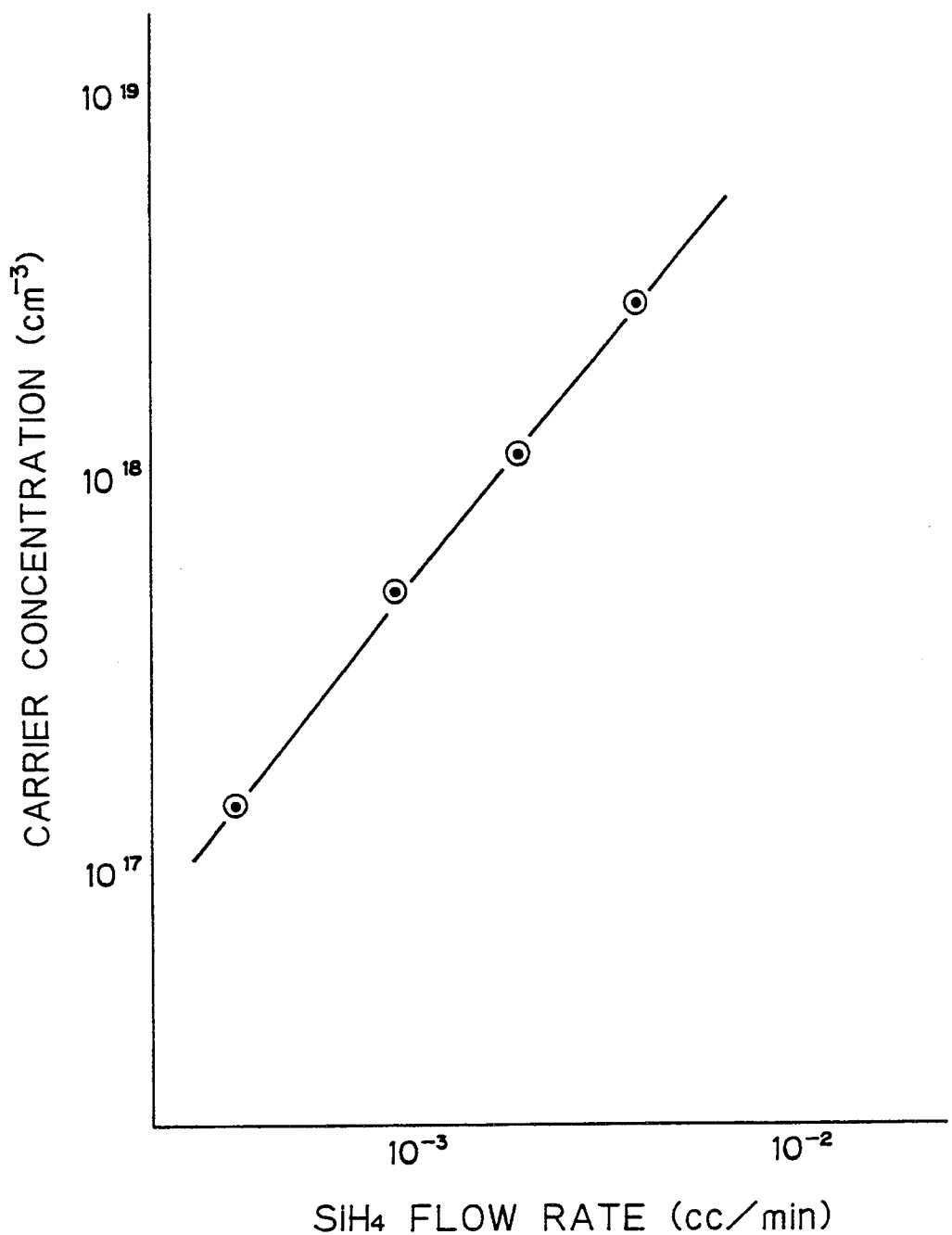
FIG. 2 is a graph showing the relationship between the flow rate of $SiH_4$ and the carrier concentration.
Figure 3:
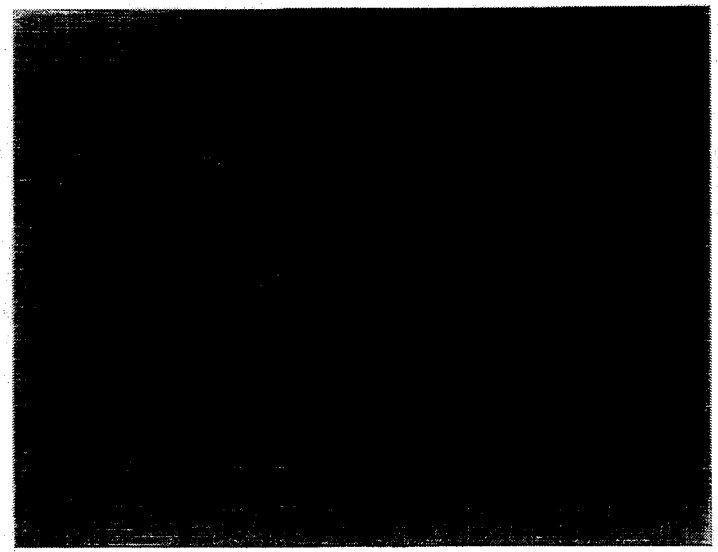
FIG. 3 is a photograph of the surface of a single crystal prepared in the Example.
Figure 4:
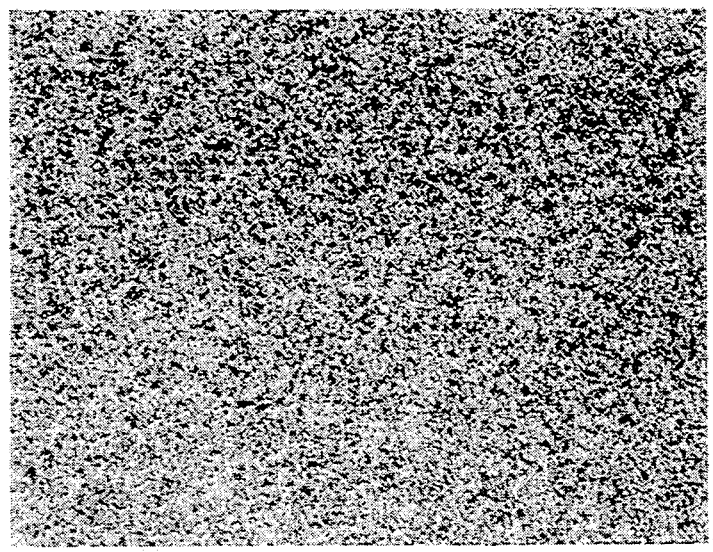
FIGS. 4a and 4b are photographs of the surface of a single crystal prepared by the conventional method.
Figure 4:
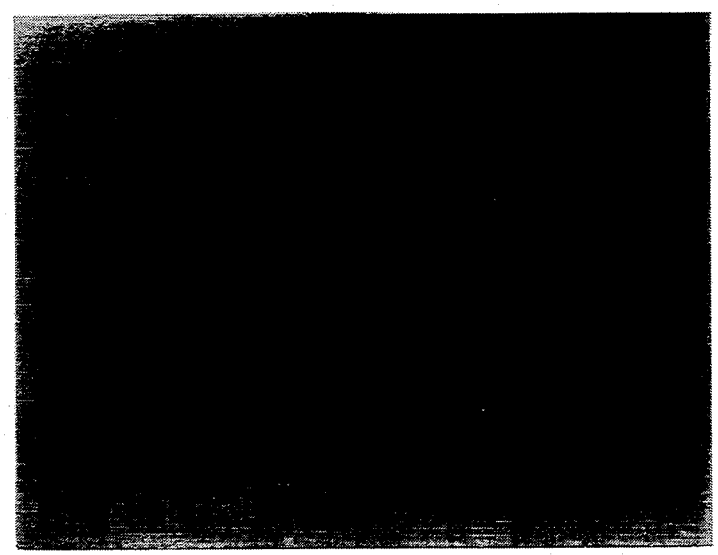
Figure 5:
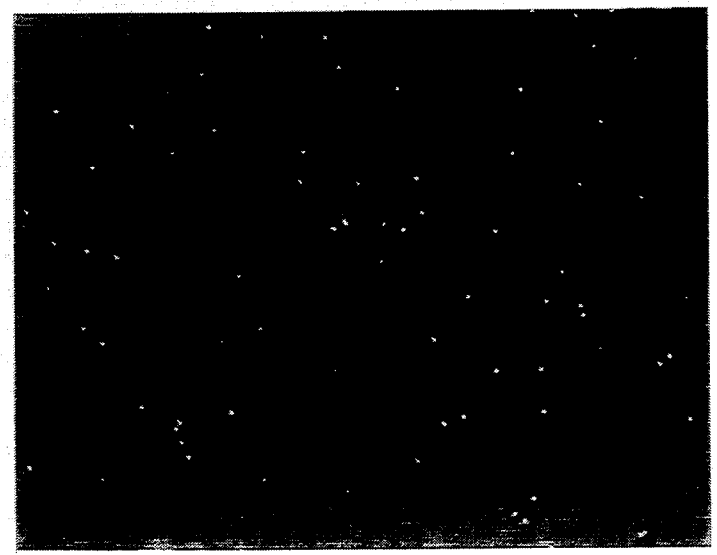
FIG. 5 is a photograph of the surface of a single crystal corresponding to a comparative example.

The growth was conducted under the conditions of a growth temperature of 600° C., a growth pressure of 20 Torr (76 Torr in the prior art), a carrier gas (hydrogen) flow rate of 6 liters/min, a TBP flow rate of 50 cc/min, and a trimethyl indium (TMI as a source of In) flow rate of 0.25 cc/min. The flow rate of SiH4 was varied from $3.4 \times 10^{-4}$ cc/min to $4 \times 10^{-3}$ cc/min. When the temperature of the substrate was raised, a flow of the carrier gas and TBP was allowed, to thereby prevent a dephosphorization of the substrate. When the temperature of the substrate reached a predetermined growth temperature, a flow of TMI and SiH4 was allowed, to thus initiate the growth. After a growth for a desired time, the supply of TMI and SiH4 was stopped to lower the temperature. The dependency of the n-type carrier concentration upon the flow rate of SiH4 is shown in FIG. 2. A single crystal free from a surface defect was also obtained in a sample subjected to doping in the highest carrier concentration, i.e., $3 \times 10^{18}$ cm$^{-3}$. A photograph of the surface of the single crystal is shown in FIG. 3. Compared with the case wherein a pit is formed by doping in the growth in a lower carrier concentration, i.e., $6.8 \times 10^{17}$ cm$^{-3}$, under a pressure of 76 Torr (see FIG. 5), it is apparent that a lowering in the growth pressure effectively eliminates this problem.

As described above, when an n-type doped InP crystal is grown by using trimethyl indium (TMI) and tert-butylphosphine (TBP) as sources and silane (SiH4) as a dopant, five factors, i.e., TMI flow rate, TBP flow rate, SiH4 flow rate, growth pressure (Pg) and growth temperature (Tg), are considered to be the growth conditions necessary for determining the carrier concentration.

The change of the carrier concentration where four factors among the five growth conditions are fixed, with only one factor being varied, will now be described.

[Dependency upon TMI Flow Rate]

The TMI flow rate is inversely proportional to the carrier concentration. Specifically, when the TMI flow rate is doubled the growth rate is doubled, and thus the carrier concentration is reduced by half.

[Dependency upon TBP]

Figure 6:
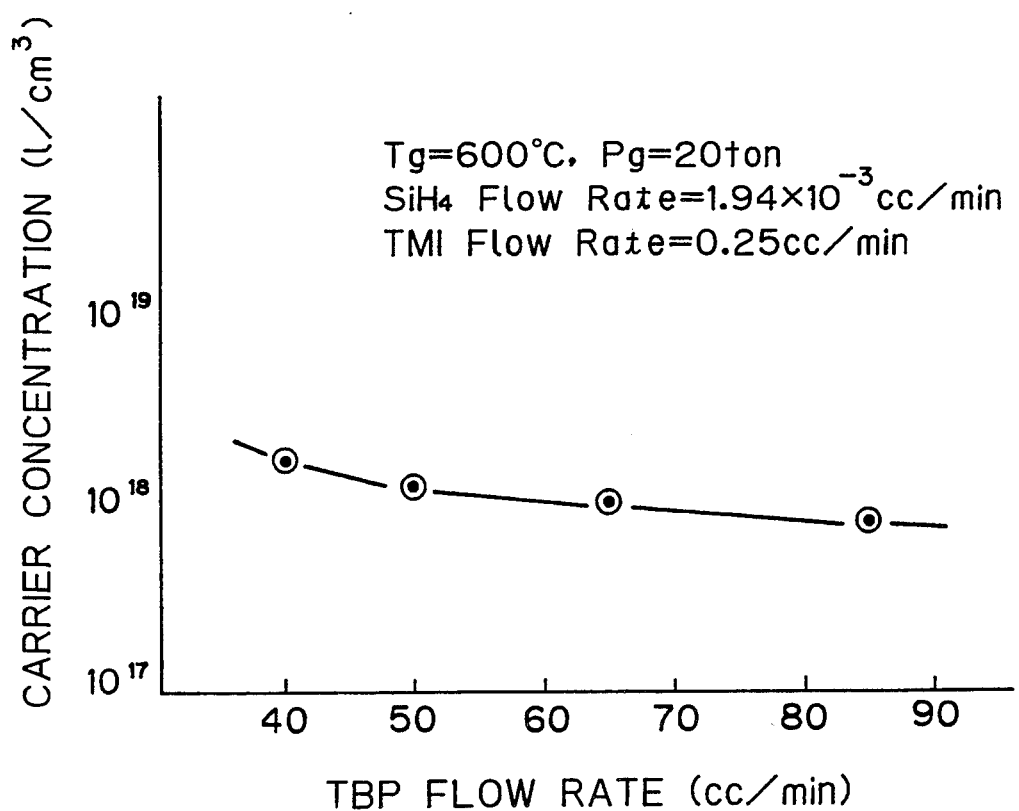
FIG. 6 is a graph showing the relationship between the TBP flow rate and the carrier concentration in the Example.

As the TBP flow rate is increased, the carrier concentration is decreased. This is shown in FIG. 6.

[Dependency upon SiH4]

When the flow rate of SiH4 is increased, the carrier concentration is increased substantially in proportion to the increase of the flow rate (see FIG. 2).

[Dependency upon Growth Pressure]

Figure 7:
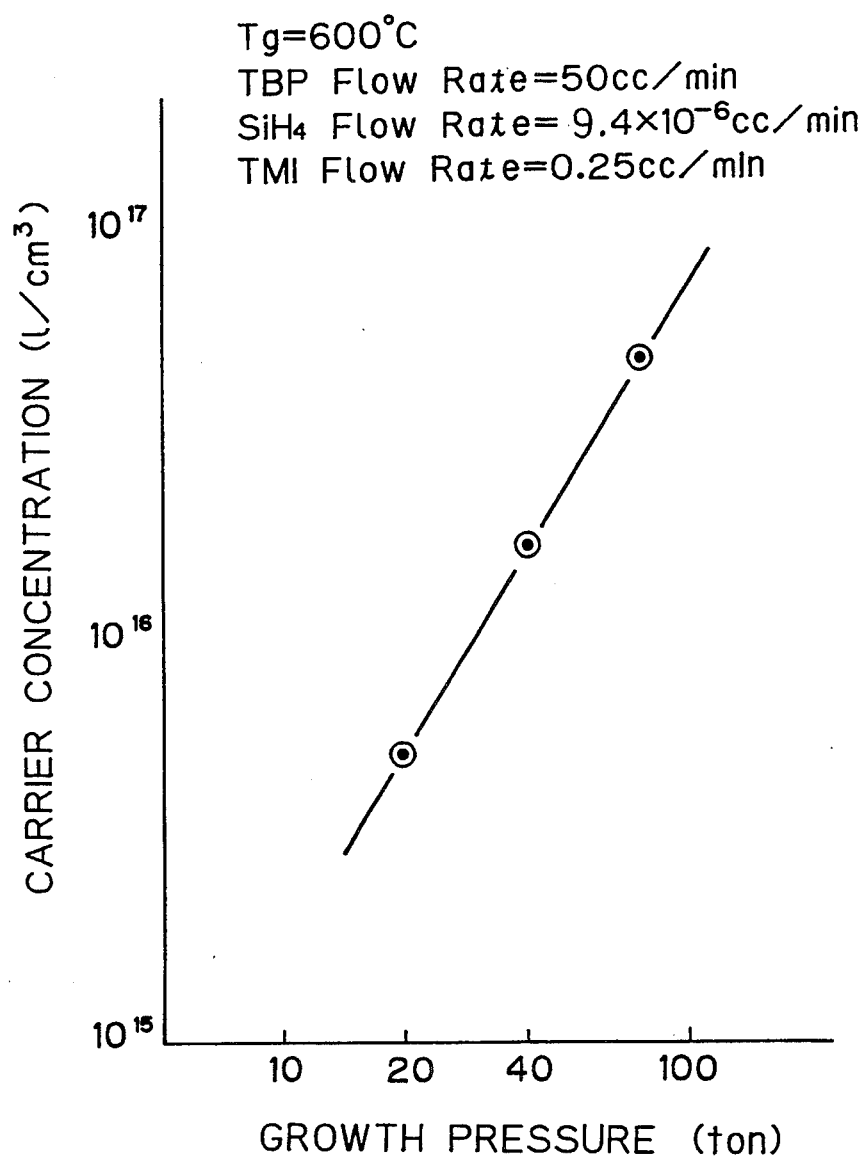
FIG. 7 is a graph showing the relationship between the growth pressure and the carrier concentration in the Example; and, FIG. 8 is a graph showing the relationship between the growth temperature and the carrier concentration.

When the growth temperature (Pg) is increased, the carrier concentration is increased in proportion to the second power of the Pg value. This is shown in FIG. 7.

[Dependency upon Growth Temperature]

Figure 8:
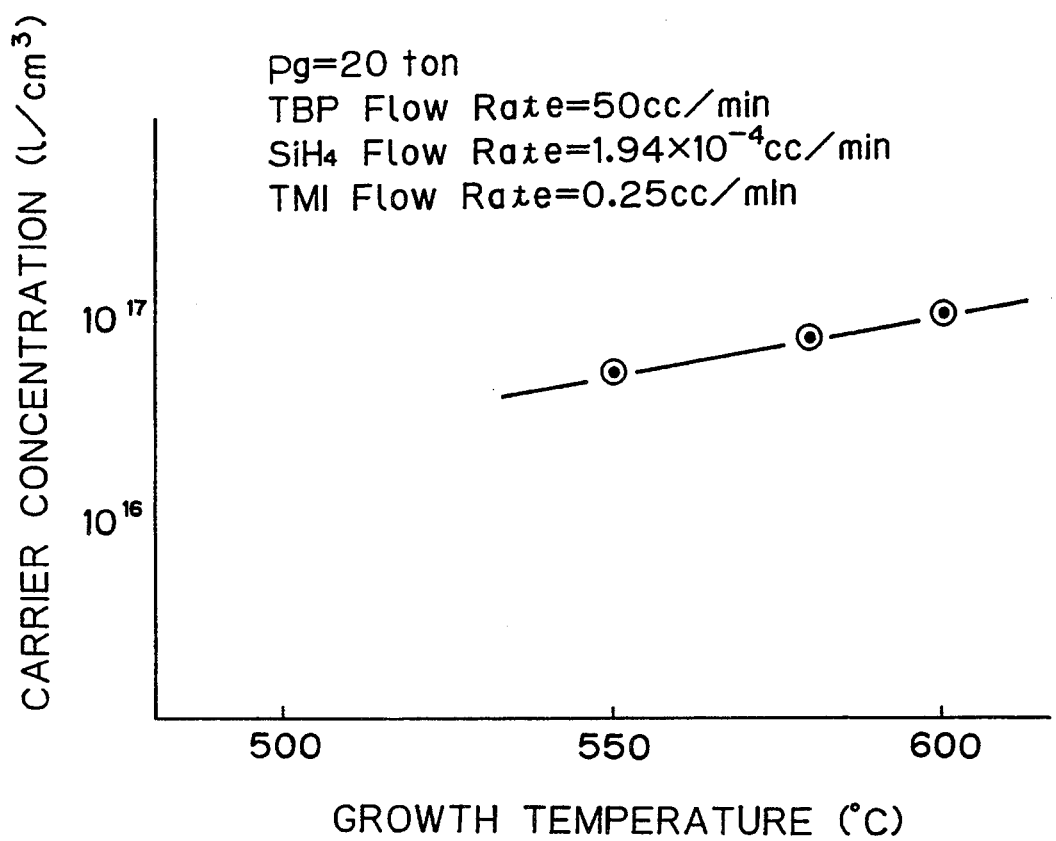

The carrier concentration is increased with an increase in the growth temperature (Tg). This is shown in FIG. 8.

Nevertheless, it is preferable to obtain a desired carrier concentration through the regulation of the flow rate of SiH$_4$, while the growth conditions other than the flow rate of SiH$_4$ are fixed.

As described above, according to the present invention, a good doping becomes possible in a growth wherein use is made of TBP, which is a safe group V element source.

I claim:

1. A process for growing a semiconductor crystal, comprising growing a group III–V compound semiconductor containing P as a group V element by metal organic vapor phase epitaxy using tertiary butyl phosphine (TBP) as a source of P constituting a grown layer and doping said semiconductor with a dopant gas during a growth of said semiconductor crystal, characterized in that said source gas and said dopant gas are fed under a condition satisfying a requirement represented by the following formula, to thereby conduct a growth of said semiconductor crystal:

$$n \leq \eta(T) \frac{f_0^{2\alpha}(P_{TBP}^0 \cdot P_D^0)^\alpha}{f_{TBP}^\alpha} \cdot P_0^{\beta-2}$$

wherein n is a carrier concentration of a growing semiconductor crystal, T is a temperature of the substrate where the semiconductor crystal is grown and of an atmosphere in the vicinity of the substrate, $\eta(T)$ is a function of the temperature T and the flow rate of the group III element of said compound semiconductor, $P_{TBP}^0$ is an equilibrium vapor pressure of TBP or a decomposition product thereof, $P_D^0$ is an equilibrium vapor pressure of said dopant gas or a decomposition product thereof, $P_0$ is a total pressure, $f_0$ is a total flow rate, $f_{TBP}$ is a flow rate of TBP, and $\alpha$ and $\beta$ are constants dependant on said dopant gas.

2. A process according to claim 1, wherein the dopant gas is one of monosilane, disilane and hydrogen sulfide gas.

3. A process according to claim 2, wherein the dopant gas is one of monosilane and disilane, $\alpha$ is 1.2, and $\beta$ is 1.6.

4. A process according to claim 2, wherein the dopant gas is hydrogen sulfide, $\alpha$ is 1.0, and $\beta$ is 1.4.

5. A process according to claim 1, wherein the temperature T is 580° to 650° C.

6. A process according to claim 1, wherein the total pressure $P_0$ is 10 to 50 Torr.

* * * * *

UNITED STATES PATENT AND TRADEMARK OFFICE
CERTIFICATE OF CORRECTION

PATENT NO. : 5,379,720
DATED : January 10, 1995
INVENTOR(S) : AKITO KURAMATA

It is certified that error appears in the above-indentified patent and that said Letters Patent is hereby corrected as shown below:

Title page [56], References Cited, line 4, delete "CMVPE" and substitute --OMVPE--;

line 4, delete "Tertiery" and substitute --Tertiary--;

Title Page, Column 2, [57] ABSTRACT, delete equation (1)

$$n \leq \eta(T) \frac{f_0^{2\alpha}(P_{TBP}^0 \cdot P_D^0)^\alpha}{f_{TBP}^\alpha} \cdot P_0^{\beta-2} \quad (1)$$

and substitute the following equation (1)

$$n \leq \eta(T) \frac{f_0^{2\alpha}(P_{TBP}^{\phantom{TBP}0} \cdot P_D^{\phantom{D}0})^\alpha}{f_{TBP}^{\phantom{TBP}\alpha}} \cdot P_0^{\beta-2} \quad (1)$$

UNITED STATES PATENT AND TRADEMARK OFFICE
CERTIFICATE OF CORRECTION

PATENT NO. : 5,379,720
DATED : January 10, 1995
INVENTOR(S) : AKITO KURAMATA

It is certified that error appears in the above-indentified patent and that said Letters Patent is hereby corrected as shown below:

Column 2, delete equation (1)

$$n \leq \eta(T) \frac{f_0^{2\alpha}(P_{TBP}^0 \cdot P_D^0)^\alpha}{f_{TBP}^\alpha} \cdot P_0^{\beta-2} \tag{1}$$

and substitute the following equation (1)

$$n \leq \eta(T) \frac{f_0^{2\alpha}(P_{TBP}^{\ 0} \cdot P_D^{\ 0})^\alpha}{f_{TBP}^{\ \alpha}} \cdot P_0^{\beta-2} \tag{1}$$

UNITED STATES PATENT AND TRADEMARK OFFICE
CERTIFICATE OF CORRECTION

PATENT NO. : 5,379,720
DATED : January 10, 1995
INVENTOR(S) : AKITO KURAMATA

It is certified that error appears in the above-indentified patent and that said Letters Patent is hereby corrected as shown below:

Column 4, delete equation (4)

$$P^0_{TBP} \cdot P_D^0 = \exp\left(\frac{\Delta H}{RT}\right) \exp\left(\frac{-\Delta S}{R}\right) \tag{4}$$

and substitute the following equation (4)

$$P_{TBP}{}^0 \cdot P_D{}^0 = \exp\left(\frac{\Delta H}{RT}\right) \exp\left(\frac{-\Delta S}{R}\right) \tag{4}$$

UNITED STATES PATENT AND TRADEMARK OFFICE
CERTIFICATE OF CORRECTION

PATENT NO. : 5,379,720
DATED : January 10, 1995
INVENTOR(S) : AKITO KURAMATA

It is certified that error appears in the above-indentified patent and that said Letters Patent is hereby corrected as shown below:

Column 4, delete equation (5)

$$P^0_{TBP} \cdot P^0_{SiH4} = \exp\left(\frac{-1.65 \times 10^4}{RT}\right) \exp\left(\frac{-0.8272}{R}\right) \quad (5)$$

and substitute the following equation (5)

$$P_{TBP}{}^0 \cdot P_{SiH4}{}^0 = \exp\left(\frac{-1.65 \times 10^4}{RT}\right) \exp\left(\frac{-0.8272}{R}\right) \quad (5)$$

UNITED STATES PATENT AND TRADEMARK OFFICE
CERTIFICATE OF CORRECTION

PATENT NO. : 5,379,720
DATED : January 10, 1995
INVENTOR(S) : AKITO KURAMATA

It is certified that error appears in the above-indentified patent and that said Letters Patent is hereby corrected as shown below:

Column 5, delete equation (9)

$$f_D \leq \frac{f_0 \cdot P_{TBP}^0 \cdot P_D^0}{P_0^2 \cdot f_{TBP}} \tag{9}$$

and substitute the following equation (9)

$$f_D \leq \frac{f_0 \cdot P_{TBP}^0 \cdot P_D^0}{P_0^2 \cdot f_{TBP}} \tag{9}$$

UNITED STATES PATENT AND TRADEMARK OFFICE
CERTIFICATE OF CORRECTION

PATENT NO. : 5,379,720
DATED : January 10, 1995
INVENTOR(S) : AKITO KURAMATA

It is certified that error appears in the above-indentified patent and that said Letters Patent is hereby corrected as shown below:

Column 8, line 1, delete equation $$n \leq \eta \ (T) \frac{f_0^{2\alpha} (P_{TBP}^0 \cdot P_D^0)^\alpha}{f_{TBP}^\alpha} \cdot P_0^{\beta-2}$$

and substitute with the following equation $$n \leq \eta \ (T) \frac{f_0^{2\alpha} (P_{TBP}{}^0 \cdot P_D{}^0)^\alpha}{f_{TBP}{}^\alpha} \cdot P_0^{\beta-2}$$

Signed and Sealed this

Twenty-third Day of May, 1995

Attest:

BRUCE LEHMAN

*Attesting Officer*          *Commissioner of Patents and Trademarks*